United States Patent [19]

Matouk et al.

[11] Patent Number: 4,691,274
[45] Date of Patent: Sep. 1, 1987

[54] MODULAR ELECTRONIC POWER SUPPLY

[75] Inventors: Anthony F. Matouk, Los Altos; David C. Hoffman, Los Gatos; Donald M. Barrus, San Jose, all of Calif.

[73] Assignee: Modular Power Corporation, Cupertino, Calif.

[21] Appl. No.: 857,110

[22] Filed: Apr. 29, 1986

[51] Int. Cl.[4] ............................................. H05K 7/20
[52] U.S. Cl. .................................... 363/141; 361/384; 165/80.3; 62/414
[58] Field of Search ................. 363/141; 361/381, 384, 361/383, 386; 165/80.3, 104.33, 104.34, 126, 916; 62/413, 414, 428, 429

[56] References Cited

U.S. PATENT DOCUMENTS

| | | | |
|---|---|---|---|
| 3,841,109 | 10/1974 | Cann | 62/414 |
| 4,233,644 | 11/1980 | Hwang et al. | 361/384 |
| 4,352,274 | 10/1982 | Anderson et al. | 361/384 |

FOREIGN PATENT DOCUMENTS 152093  8/1985  European Pat. Off. ............ 361/383

OTHER PUBLICATIONS

IBM Technical Disclosure Bulletin, vol. 22, No. 2, Jul. 1979, pp. 696 and 697.

Primary Examiner—Patrick R. Salce
Assistant Examiner—Judson H. Jones
Attorney, Agent, or Firm—Flehr, Hohbach, Test, Albritton & Herbert

[57] ABSTRACT

Electronic power supply comprising a framework having front and rear sides and top and bottom sides and having a vertically disposed space extending upwardly from the bottom of the framework through the top of the framework. It also is comprised of a plurality of power modules disposed in the framework and having heat sinks extending into the vertically disposed space. Fans are provided for forcing air in a vertical direction through the space.

14 Claims, 6 Drawing Figures

AIR FLOW

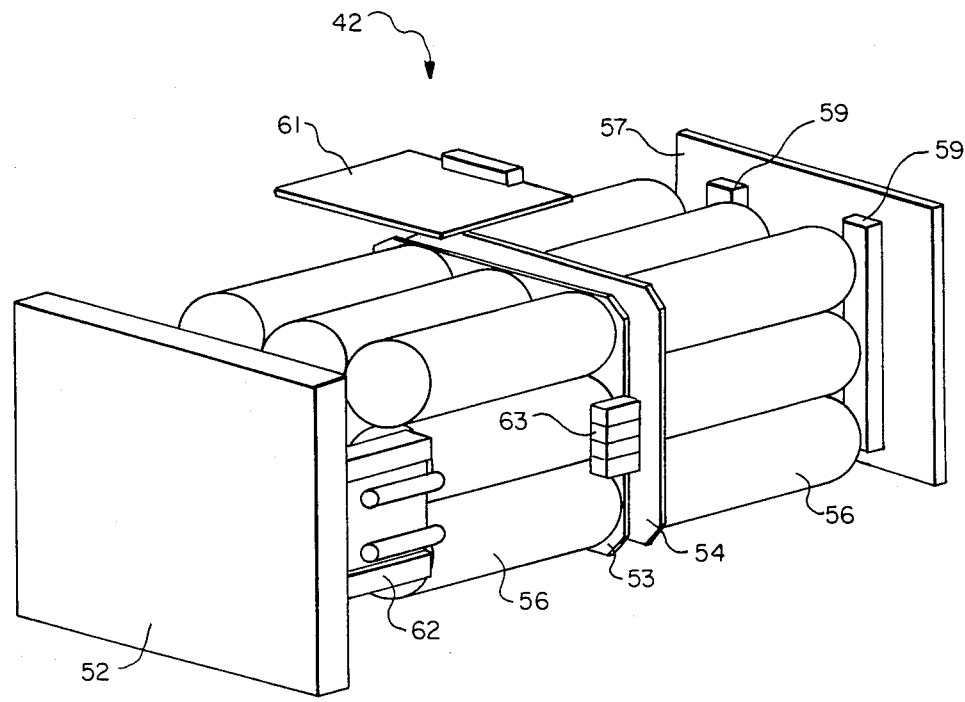
FIG. —5
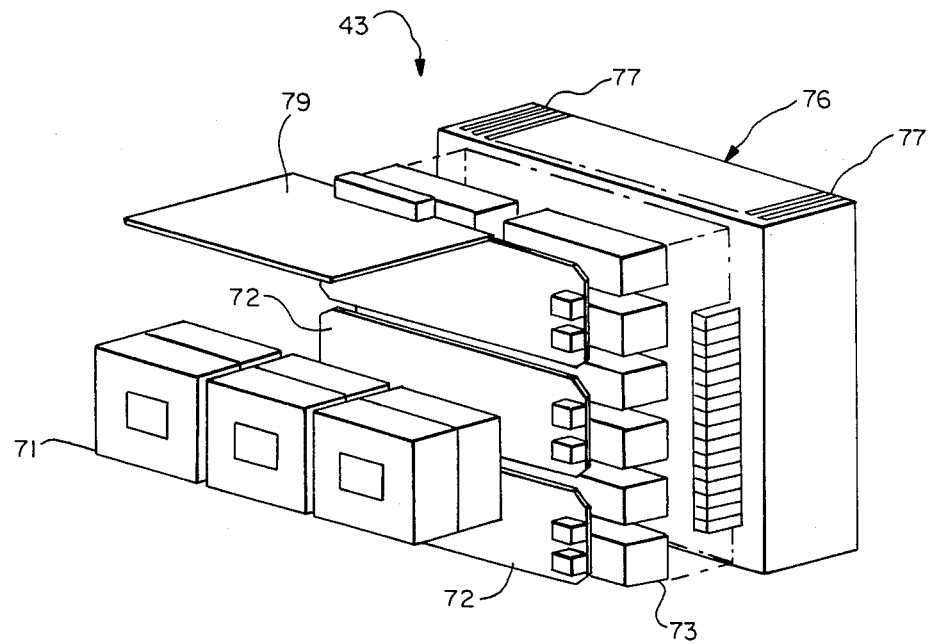
FIG. —6

MODULAR ELECTRONIC POWER SUPPLY

This invention relates to modular electronic power supply and method for providing precise reliable power.

Power systems have heretofore been provided which have been used in applications that require precise reliable power such as small and large computer installations, telecommunictions installations, motor control, fork lifts, electric cars, semiconductor processing plants, hospitals. Such types of power systems have taken the form of motor generators (MG) and uninterruptible power systems (UPS). Such motor generator systems supply power output by use of a motor and a generator. Energy storage is provided by the inertia of the system making it possible for a motor generator system to ride out minor outages (½ second) and relatively long under voltages (brownouts). Motor generator systems have a relatively poor power factor and efficiency. Uninterruptible power systems in the prior art supply an electronic power output but contain no internal energy storage. It is therefore necessary to have a battery pack attached in order to provide even the one-half second capability of a motor generator set. There is therefore a need for a new and improved self-contained electronic power supply and method.

In general, it is an object of the present invention to provide an electronic power supply and method which is particularly adapted for use with computers and other applications having similar requirements.

Another object of the invention is to provide a power supply and method of the above character which is precise and reliable.

Another object of the invention is to provide an electronic power supply of the above character which can be modularized.

Another object of the invention is to provide an electronic power supply of the above character which is self-contained.

Another object of the invention is to provide an electronic power supply of the above character which is relatively simple in design and has enhanced tolerance for high voltage spikes, short term outages and under voltages in the main power supply line.

Another object of the invention is to provide an electronic power supply of the above character which serves as a stabilized power unit which will provide high power density with high reliability of low cost and low noise because of built-in redundancy.

Another object of the invention is to provide an electronic power supply which utilizes basic interchangeable modules.

Another object of the invention is to provide an electronic power supply of the above character which is of comparatively low cost.

Another object of the invention is to provide a power supply of the above character which has a long mean time to failure.

Another object of the invention is to provide an electronic power supply of the above character which has a high operating efficiency and which has built in power factor correction.

Another object of the invention is to provide an electronic power supply of the above character which requires a relatively small amount of space.

Another object of the invention is to provide an electronic power supply of the above character which has low noise and is relatively quiet in its operation.

Another object of the invention is to provide an electronic power supply of the above character which utilizes DC to DC converters.

Another object of the invention is to provide an electronic power supply and method of the above character which uses AC voltage synthesis with built in energy storage.

Additional objects and features of the invention will appear from the following description in which the preferred embodiments are set forth in detail in conjunction with the accompanying drawings.

FIG. 5 is an isometric view of an RTC module (ride through capacitor module) which is utilized in the electronic power supply shown in FIGS. 1-3.

FIG. 6 is an isometric view of an EMG/SPU (electronic motor generator/special power unit) module which forms a part of the power supply as shown in FIGS. 1-3.

The electronic power supply of the present invention is comprised of framework having front and rear sides and top and bottom sides. It also has a vertically disposed space extending upwardly from the bottom of the framework through the top of the framework. A plurality of power modules are disposed in the framework and have heat sinks extending into the vertically disposed space, means for forcing air in a vertical direction through the space.

Figure 1:
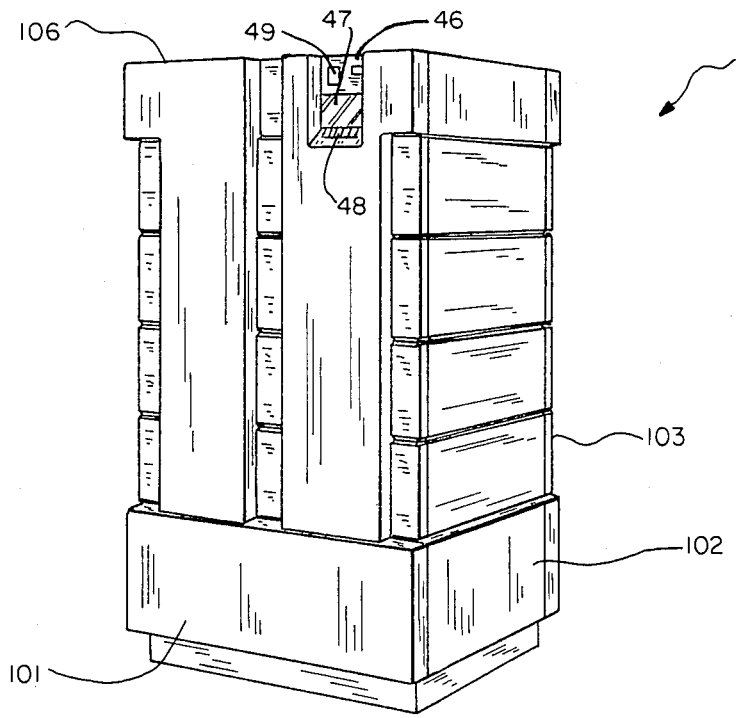
FIG. 1 is a perspective view of an electronic power supply incorporating the present invention.

More in particular, the electronic power supply 11 of the present invention consists of a rectangular framework 12. The framework 12 can be formed of any suitable material. For example, as shown, it can be formed of tubular steel which is square in cross section. The framework 12 is formed in such a manner so that four sections 13, 14, 15 and 16 are provided lying in vertically spaced horizontal planes in which section 13 is the lowermost section, sections 14 and 15 are intermediate sections and section 16 is the top section. The lower section 13 viewed from left to right in FIG. 1 is divided into side, intermediate and side compartments 17, 18 and 19 and similarly the intermediate section 14 is divided into side, intermediate and side compartments 21, 22 and 23. Similarly, the intermediate section 15 is provided with side, intermediate and side compartments 24, 26 and 27. The top section 16 is provided with an intermediate compartment 29.

Figure 3:
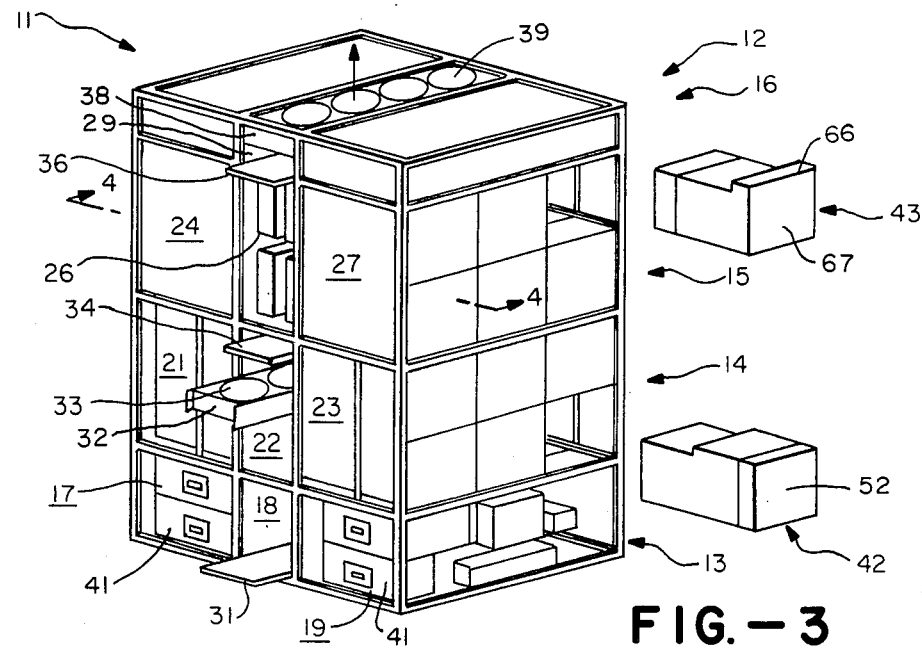
FIG. 3 is an isometric view of the framework of the electronic power supply shown in FIG. 1 in conjunction with the modular units.
Figure 4:
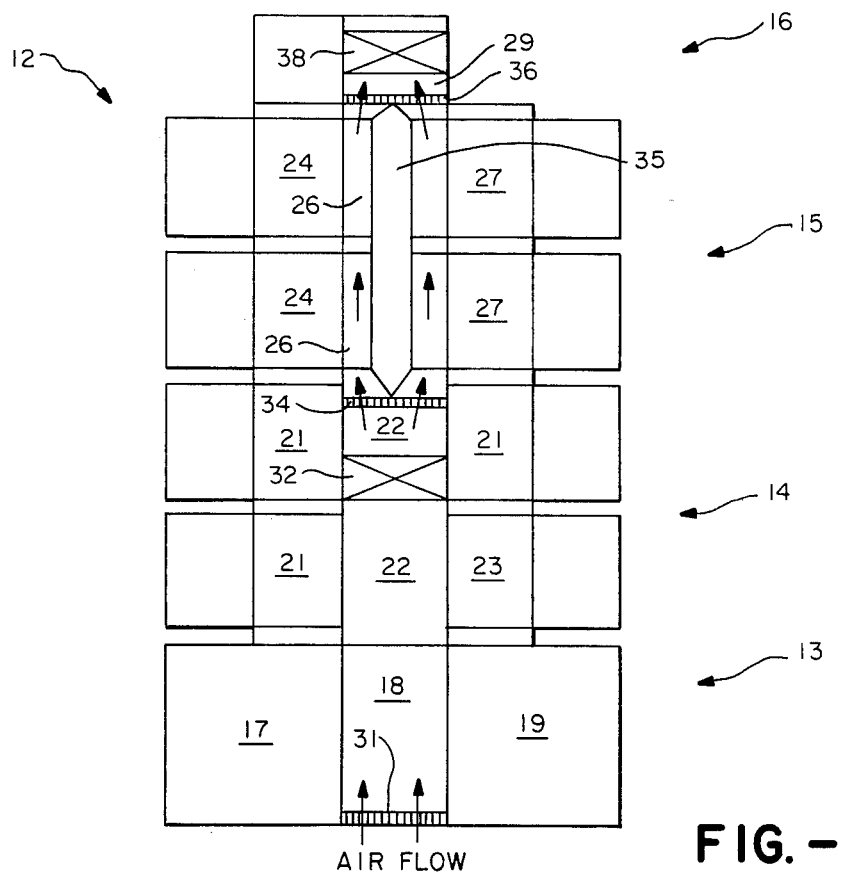
FIG. 4 is a cross sectional view taken along the line 4—4 of FIG. 3.

As can be seen in FIGS. 3 and 4 the intermediate section 18, 22, 26, and 29 serves as a pathway for the vertical flow of air from the bottom to the top. This intermediate section 18 is open at its bottom extremity as shown in FIG. 4 and air flows upwardly through the same, first through an air filter 31 which is slidably mounted in a horizontal plane in the framework 12 so that it can be inserted and removed from the framework 12 through one end of the framework 12. The air after passing through the air filter 31 passes upwardly through the lower fan drawer 32 which is also mounted in the framework 12 for the slidable movement in a horizontal plane out the same end of the framework. The lower fan drawer 32 is provided with a plurality of motor driven fans 33 as, for example, four fans of a conventional pancake type. The fans can be DC fans which are supplied with power from the output of the electronic power supply 11.

Slightly above the lower fan drawer 32 there is an air straightener 34 which is slidably mounted in a horizontal plane in the intermediate compartment 22 of the intermediate section 14 for movement into and out of the same end of the framework 12. This serves to straighten out the air which is pushed out of the fan drawer 32. The fans 33 provided in the fan drawer 32 serve to pull the air upwardly through the intermediate section 14 and to push it through the air straightener 34. The air continues to move upwardly through the intermediate and top sections 15, 16 around a vertically disposed subsonic solid wall diffuser or baffle structure 35 mounted in the framework 12 to perform its cooling function as hereinafter described. The diffuser 35 has triangularly-shaped upper and lower ends to facilitate air flow. The diffuser 35 extends substantially the entire length of the compartment. The air after it passes the diffuser 35 travels through another air straightener 36 of the honeycomb type disposed in the upper portion of the intermediate compartment 29 of the top section 16. This air straightener 36 is also slidably mounted in the framework and can be moved in a horizontal plane inwardly and outwardly through the same end of the framework 12. Immediately above the air straightener 36 there is provided an upper fan drawer 38 slidably mounted for movement in a horizontal plane in the intermediate compartment 29. It is provided with a plurality of additional fans 39 as, for example, four fans similar to the fans provided in the lower fan drawer 32. The fans 39 are operated in such a manner that they serve to pull the air out from the intermediate compartment 26. Thus it can be seen that the two fan drawers 32 and 38 operate in a push-pull manner to push and pull air through the framework 12 at a substantially uniform velocity and a substantially uniform distribution of air flow in a horizontal plane for the purpose of cooling the electronic components provided in the various compartments of the framework 12.

An input/output module 41 is mounted in each of the side compartments 17 and 19 in the lower section 13 and on opposite sides of the compartment 18 through which the air flows vertically as hereinbefore described. The details of the construction of this input/output module 41 will not be described in that they provide relatively standard input and output connections for use with a computer (not shown). For example, if the entire electronic power assembly 11 is mounted on a computer floor, the wiring for the electronic power supply 11 can be brought up through the computer floor and into the input/output modules 41. The modlue 41 typically includes circuit breakers and fuses. It also includes a bias power supply connected to the output of the electronic power supply 11 which supplies power to the DC fans 33, 39 under computer control. The modules 41 also include a static bypass switch which permits bypassing of the electronic power supply 11 in the event of multiple failures in the same.

Similarly, ride through capacitor (RTC) modules 42 are provided in the compartments 21 and 23. Thus, as shown, there are provided six of such RTC modules 42 in each of the compartments and in which the modules are slidably mounted for movement in a horizontal plane as indicated in FIG. 1 for movement into and out of the framework 12 by movement through one of the sides of the framework 12. Thus it can be seen there are provided two rows stacked one above the other with three of the RTC modules being in each row to provide a total of six in each compartment 21 and 23 for a total of 12.

A plurality of electronic motor generator modules or special power unit modules 43 (EMG/SPU) are disposed in the compartments 24 and 27 in the section 15. Thus as shown in FIG. 1 there are provided two spaced parallel rows of three EMG/SPU modules in each of the compartments 24 and 27 to provide a total of six such modules for each compartment for a total of 12 for the framework 12. As with the RTC modules 42, the EMG/SPU modules 43 are mounted for slidable movement in parallel horizontal planes in and out of the sides of the framework 12.

A control console 46 (FIG. 1) is mounted on the framework 12 immediately above the compartment 27 in the upper section 16. It comprises a CRT display 47, control buttons 48 and an emergency power off indicator 49.

A typical ride through capacitive (RTC) module 42 is shown in FIG. 5. As shown therein, each RTC module 42 is in the form of a drawer which is slidably mounted in the framework 12. The RTC module 42 is rectangular in vertical and horizontal cross sections. It consists of a front cover 52 and first and second spaced apart vertically disposed mounting boards 53 and 54. A plurality of capacitors 56 are mounted on each of the mounting boards 53 and 54. For example, as shown nine of such capacitors 56 can be mounted on each board with the capacitors being disposed three in a row with three rows disposed in horizontal planes. The capacitors 56 are of a conventional type and are of a suitable size as, for example, 3900 $\mu f$ and rated at 600 volts. A base plate 57 is provided at the rear of the module 42 and has mounted thereon a pair of spaced apart vertically disposed ballast resistors printed circuit boards 59 with each printed circuit board carrying nine 1000 ohm resistors to provide for each printed circuit board a total resistance of 9,000 ohms with 18 watts in power dissipation.

An address decoder printed circuit board 61 is also provided as a part of the RTC module 42. It is of conventional construction which can be readily developed by one skilled in the art. In addition, there is provided a fuse printed circuit board 62 as well as a power connector 63. The power connector 63 is of a type which is engaged when the RTC module is seated within the framework 12 and is disengaged when the RTC module is removed. Cooling for the RTC module is accomplished by conduction from the exterior walls of the module into the room and also into the compartment 22 through which the air is passing. The mounting boards 53 and 54, the base plate 57 and the front cover 52 are fastened together with a unitary assembly by the use of support posts (not shown) and threaded rods (not shown) threaded therein.

A typical RTC module 42 constructed in accordance with the present invention can provide a ride through time of greater than 100 milliseconds. An RTC module having such capabilities can be provided having a weight of approximately 32 pounds.

The EMG/SPU module 43 (FIG. 6) is also in the form of a drawer 66 which is slidably mounted in a framework 12. It is also rectangular in vertical and horizontal cross sections. It is provided with a front cover 67. The EMG/SPU module also consists of a plurality of inductors 71 as, by way of example, two for each phase for a total of six for three phases to be mounted on each of three vertically disposed connector boards 72 in substantial vertical alignment. Each of the inductors has a value of approximately 150 microhenries. Each module 43 is also provided with a plurality of power hybrids 73. The power hybrids 73 are connected to power connectors 74. The power connectors 74 and the power hybrids 73 are mounted on heat sink 76.

The heat sink 76 consists of a plurality of vertically disposed spaced apart fins 77 which extend into the air flow passing vertically through the compartment 26. The heat sink 76 can be formed of a suitable material such as aluminum. The fins 77 are designed in such a manner so that the length of the boundary layer is greater than the length of the heat sink in the path of the air flow to minimize the effect of heat accumulation at the second or top fan drawer 38. In other words, the length of the boundary layer in the bottom fan drawer 32 is greater than the length of the fin so that the accumulation of heat in the top fan drawer 38 is no greater than the accumulation of heat in the lower fan drawer 32. By utilizing such a construction, a cooling efficiency improvement on the order of 35% can be accomplished. To provide such a boundary layer, the fins 77 can have a depth of 2 inches and a length of 8 inches with each of the fins having a thickness of approximately 0.1 of an inch and with spacing between the fins being approximately 0.2 of an inch. By utilizing such a heat sink 76, adequate cooling is provided for the EMG/SPU modules.

It shoud be appreciated that if additional ride through capability is required for the electronic power supply, a battery type module can also be provided. The batteries can be of conventional cylindrical type as for example a type D cell having a 2 volt, 2.5 amp hour capability. Such capabilities can be readily provided by lead acid batteries of this type utilizing a jelled electrolyte. The number of cells provided for the battery module will depend on the output voltage for the electronic power supply.

Figure 2:
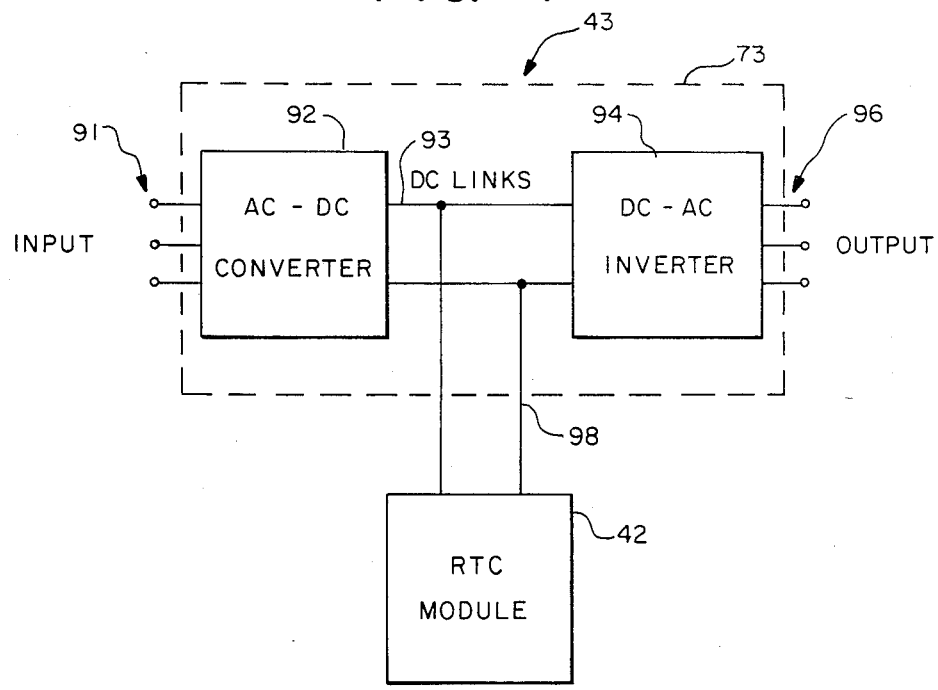
FIG. 2 is a block diagram of the circuitry utilized in the electronic power supply shown in FIG. 1.

A block diagram of the system utilized in the modular electronic power supply 11 is shown in FIG. 2. As shown therein, the input 91 to the electronic power supply is adapted to be connected to voltages ranging from 208 to 480 volts AC three phase from 32 to 512 Hz with the capability of having the input vary from −50% to +10%. The input is connected to an EMG/-SPU module 43 which is hereinbefore explained includes power hybrids 73. The power hybrids 73 include an AC to DC converter 92 which is connected by a DC link 93 to a DC to AC inverter 94. The inverter is connected to an output 96 for the electronic power supply which will supply 208 to 480 volts AC three phase at ±1% at 32 to 512 Hz. An RTC module 42 is shown connected to the DC link 93 by an interconnect 98. As hereinbefore explained, the RTC module can be comprised of capacitors to provide short term ride through capability or if a longer term ride through capability is desired, it can include a battery backup of the type hereinbefore described.

The specific electronics utilized in the AC to DC converter 92 and DC-AC inverter 94 are disclosed in copending application Ser. No. 857,145, filed Oct. 29, 1986.

In the modular electronic power supply, the three phase AC input is supplied to each of the EMG/SPU modules in the electronic power supply. For example, for the 120 KW electronic power supply the power is supplied to twelve of such EMG/SPU modules, or to six of such modules for a 60 KW supply. As shown in FIG. 2, this power supply to an AC-DC converter 92 which provides a regulated DC output which utilizes supply power to the RTC module 42 or alternatively an RTC module which includes capacitors and a battery backup. The power is supplied also to the DC-AC inverters 94 to generate a three phase sine wave output voltage on the output 96. Alternatively if desired, the DC from the AC-DC converter can be supplied to external DC-DC converters of other loads. The control console 46 provides a microprocessor command section which regulates and coordinates the functions of the EMG/SPU module 43. It also provides all communications to the operator via a five inch CRT display 47. This display provides all metering and monitoring information through numerous menus and display screens. At any time the operator can call up comprehensive help information that will describe every aspect of the display and machine control.

The frame 12 is provided with exterior cabinetry as shown particularly in FIG. 1 and consists of a front panel 101, side panels 102 and a rear panel 103 all of which are readily removable. The panels 101, 102 and 103 and the framework 12 carry cooperative engagement means of a suitable type such as L-shaped members (not shown) secured to the framework 12 and the panels 101, 102 and 103 which are engaged to support the panels on the frame. By providing such removable panels, easy access can be obtained to facilitate removal of the modules 42 and 43 and to obtain access to other components such as the fan drawers 32 and 38. A top panel 106 is also provided which is secured to the top of the framework 12 by suitable means such as screws (not shown). The top panel 106 is provided with a centrally disposed grille (not shown) extending from the front to the rear of the power supply 11 through which air can escape upwardly.

The EMG/SPU modules 43 and the RTC modules 42 have been constructed in such a manner so that the modules 42 and 43 can be removed individually while the electronic power supply 11 is still in operation. In other words, it is unnecessary to interrupt the power. This makes it possible to remove a defective module and to replace it with another module while the defective module is being repaired. The removal of the modules can be accomplished without substantially disrupting the flow of cooling air for the other modules still being operated in the electronic power supply 11. The use of such interchangeable modules makes possible increased reliability for the electronic power supply.

Although the electronic power supply is particularly adapted for use with large computers, it also can be utilized for providing aircraft gate power, power for telecommunication products as well as semiconductor process equipment and hospital generator systems where very high reliability non-interruptible power sources are necessary.

The electronic power supply of the present invention not only contains electronic internal energy storage for direct motor generator system replacement, but with the use of optional batteries attached to the same the electronic power supply can function as a full uninterruptible power system capable of many minutes of operation during a blackout.

The electronic power supply of the present invention is significantly more reliable than presently available power systems. Mean time to failure of a motor generator set typically is 50 hours, assuming that it receives maintenance every 5,000 to 10,000 hours. On the other hand, mean time to failure of the electronic power supply of the present invention should be greater than 200,000 hours with no maintenance required. In addition, the electronic power supply is advantageous in that it is more cost effective and requires less space in the computer room or in other application. It can be readily provided with built-in power factor correction with its higher operating efficiency, the electronic power supply can recover costs in energy savings within a relatively short period of time as, for example, within a period of five years.

The electronic power supply of the present invention operates somewhat more quietly than existing systems. Typically the electronic power supply would have an audible moise at 60 DB on the A scale at 3 feet. The power supply operates well above audio frequencies so there is no audible noise except for the fans. Because of this low noise, it is unnecessary to remotely locate such electronic power supplies, thus greatly reducing the cost of installation of such electronic power supplies in comparison to that of conventional emergency power supplies. Since the electronic power supply 11 can be constructed in such a manner so that it is provided with a DC output, it permits the use of inexpensive AC to DC converters to make possible further price and size savings.

Because of the modular construction of the electronic power supply, it can be seen that it can be readily constructed in various sizes. Thus by way of example a 120 kilowatt size has been shown in FIG. 1. However, it can be readily scaled up or down to provide other systems of any desired size system as for example 240 kilowatts or 60 kilowatts.

The electronic power supply of the present invention makes it possible to maintain output power while the input voltage drops to 50% of nominal. The power supply in addition will provide a high input power factor of greater than 0.95 under all operating conditions. It has an operating efficiency of at least 95%. It is relatively small in size and is to relatively light weight. The power module can have a weight of approximately 45 pounds, the RTC capacitor module approximately 40 pounds, and the battery module approximately 95 pounds. Internal redundancy is provided because a plurality of the various modules utilized in the power supply are provided. Because of the use of redundant modules on-line replacement is possible. Ride through capability of at least 0.5 second can be provided by the use of the capacitive type ride through module which can be increased to approximately 5 minutes with the addition of the battery backup. Typically the capacitor RTC module can support a 10 KW load per module for 100 milliseconds. On the other hand, a battery module can support a 10 KW load per module for 5 minutes. Even a single phase operation is possible if the remaining phase voltage is within nominal rating and the load is less than 58% of the flow rated load. With respect to the output, the voltge can be adjusted within +5% to −2% of nominal. A regulation of 1% can be achieved for a balanced load and 1.5% for a 50% unbalanced load. The power supply has a frequency stability of 100 parts per million per °C. A frequency accuracy of 0.1% of nominal can be achieved. The frequency slew rate is adjustable within 1 Hz per second. The load power factor may range from 0.8 to 1.0 at full rating for the power supply.

With the present power modules 53, current ratings of 350, 700 and 1400 amperes can be achieved at 208 volts by the use of 6, 12 and 24 power modules, respectively. Overloads of 150% of full loads for ten minutes can be accommodated as well as 200% of full load for 1 minute.

The static transfer switch has a continuous rating equal to the full load reading of the power supply. It has an overload rating of 1000% of full load for 16 milliseconds, 500% of full load for 100 milliseconds and 200% of full load for 1 minute. It has an operating time of 4 milliseconds maximum. It is capable of sensing over temperatures and provide warnings outside of shutdown limits. Also it will provide an appropriate alarm when a short in the SCRs is detected in the power module 43.

What is claimed is:

1. In an electronic power supply, a framework having front and rear sides and top and bottom sides and having a vertically disposed space extending upwardly from the bottom of the framework through the top of the framework, a plurality of vertically spaced power modules disposed in the framework on opposite sides of the vertically disposed space and having vertically disposed heat sinks extending into the vertically disposed space, said heat sinks including a plurality with vertically disposed spaced apart fins extending into said vertically disposed space and means carried by the framework for forcing air in a vertical direction through the vertically disposed space, said vertically disposed space being free of impediments between the vertically disposed heat sinks so that the air can travel uninterrupted through the spaced apart fins in said vertically displaced space.

2. A power supply as in claim 1 wherein said means for forcing air through the vertically disposed space in the framework includes a plurality of fans disposed in a horizontal plane for forcing air in an upward direction, air straightener means disposed above the fans so that there is provided a constant uniform velocity of air substantially uniformly distributed horizontally in the vertically disposed space.

3. A power supply as in claim 1 wherein said means for forcing air through the vertically disposed space in the framework includes upper and lower sets of fans disposed in spaced apart horizontal planes for forcing air in a vertical direction.

4. A power supply as in claim 3 wherein the fins have a predetermined length in a vertical direction in the vertically disposed space and wherein the lower set of fans creates a boundary layer having a length which is greater than the predetermined length of the fins.

5. A power supply as in claim 2 together with a plurality of additional fans disposed in a horizontal plane spaced apart from the first named fans to move the air in a vertical direction.

6. A power supply as in claim 5 wherein the first named fans are operated in a direction to push air through the air space and wherein the additional fans are operated so as to pull air through the air space.

7. A power supply as in claim 6 together with an additional straightening means disposed above the additional fans.

8. A power supply as in claim 5 wherein said first named fans are disposed in a first drawer slidably mounted in a horizontal plane in the framework and wherein the additional fans are disposed in a second drawer slidably mounted in a horizontal plane in the framework.

9. A power supply as in claim 8 wherein said air straightener means are slidably mounted in the framework for movement in horizontal and parallel planes.

10. A power supply as in claim 1 together with a diffuser carried by the framework in the vertically disposed space and extending along said heat sinks of said power module for directing upwardly moving air into the heat sinks.

11. A power supply as in claim 1 together with means for mounting said power modules in said framework for sliding movement towards and away from said vertically disposed space so that said power modules can be readily removed from said framework.

12. In an electronic power supply, a framework having front and rear sides and top and bottom sides and having a vertically disposed space extending upwardly from the bottom framework through the top of the framework, said framework being formed to provide a plurality of vertically spaced horizontally disposed compartments on opposite sides of the vertically disposed space, input/output modules disposed in the lowermost compartments, ridethrough capacitor modules disposed in compartments above the lowermost compartments and an electronic motor generator/special power unit modules disposed in compartments overlying the compartment ion which the ridethrough capacitor modules are disposed, means mounting the ridethrough capacitor modules and the electronic motor generator/special power unit modules for sliding movement into and out of the framework towards and away from the vertically disposed space and permitting ready removal of the modules, a control console carried by the framework, the power unit modules having vertically disposed heat sinks extending into the vertically disposed space, the heat sinks including a plurality of vertically disposed spaced apart fins extending into said vertically disposed space and having a predetermined length and means carried by the framework for forcing air in a vertical direction through the vertically disposed space.

13. A power supply as in claim 12 wherein said means for forcing air through the vertically disposed space in the framework includes upper and lower sets of fans disposed in horizontal planes in the vertically disposed space for forcing air in a vertical direction in the vertically disposed space.

14. A power supply as in claim 13 wherein the fins have a predetermined length in a vertical direction in the vertically disposed space and wherein the lower set of fans creates a boundary layer having a length which is greater than the predetermined length of the fins.

* * * * *